(12) United States Patent
Lee et al.

(10) Patent No.: US 12,390,763 B2
(45) Date of Patent: Aug. 19, 2025

(54) APPARATUS TRAPPING AN EXHAUST MATERIAL FROM A SUBSTRATE-PROCESSING PROCESS AND APPARATUS FOR PROCESSING A SUBSTRATE INCLUDING THE TRAPPING APPARATUS

(71) Applicant: SAMSUNG ELECTRONICS CO., LTD., Suwon-si (KR)

(72) Inventors: Uihyoung Lee, Hwaseong-si (KR); Suji Gim, Hwaseong-si (KR); Hongsik Park, Suwon-si (KR); Taeheon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 487 days.

(21) Appl. No.: 17/708,217

(22) Filed: Mar. 30, 2022

(65) Prior Publication Data

US 2023/0068823 A1    Mar. 2, 2023

(30) Foreign Application Priority Data

Sep. 2, 2021   (KR) .......................... 10-2021-0116935

(51) Int. Cl.
*B01D 53/76*    (2006.01)
*B01D 45/16*    (2006.01)
(Continued)

(52) U.S. Cl.
CPC ............. *B01D 53/76* (2013.01); *B01D 45/16* (2013.01); *B01D 53/38* (2013.01); *B04C 5/085* (2013.01);
(Continued)

(58) Field of Classification Search
CPC ........ B01D 53/76; B01D 45/16; B01D 53/38; B04C 5/085; B04C 5/15; B04C 5/185; B04C 9/00; H01J 37/32844
(Continued)

(56) References Cited

U.S. PATENT DOCUMENTS 4,948,396 A * 8/1990 Barnes .................... B01D 50/20
55/315
5,762,666 A * 6/1998 Amrein .................. B01D 45/16
55/432

(Continued)

FOREIGN PATENT DOCUMENTS

JP    19960052383    2/1996
JP    2005-131509    5/2005
(Continued)

OTHER PUBLICATIONS

Office Action dated Jan. 30, 2023 from the Korean Intellectual Property Office (KIPO) issued in corresponding Korean Patent Application No. 10-2021-0116935.

*Primary Examiner* — Charlee J. C. Bennett
(74) *Attorney, Agent, or Firm* — Morgan, Lewis & Bockius LLP

(57) ABSTRACT

An apparatus for trapping an exhaust material from a substrate-processing process includes: a cyclone configured to provide the exhaust material with a swirling flow, wherein the exhaust material is discharged from the substrate-processing process using a reaction gas; an atomization module for providing the cyclone with a mist to convert the exhaust material into a powder through a wet oxidation reaction; and a collector configured to collect the powder.

18 Claims, 13 Drawing Sheets

(51) Int. Cl.
- *B01D 53/38* (2006.01)
- *B04C 5/085* (2006.01)
- *B04C 5/15* (2006.01)
- *B04C 5/185* (2006.01)
- *B04C 9/00* (2006.01)
- *C23C 16/44* (2006.01)
- *H01J 37/32* (2006.01)
- *H01L 21/67* (2006.01)

(52) U.S. Cl.
CPC ............... *B04C 5/15* (2013.01); *B04C 5/185* (2013.01); *B04C 9/00* (2013.01); *H01J 37/32844* (2013.01); *H01L 21/67017* (2013.01); *B01D 2258/0216* (2013.01); *B04C 2009/008* (2013.01); *C23C 16/4412* (2013.01); *H01L 21/67063* (2013.01)

(58) Field of Classification Search
USPC .................................................. 156/345.29
See application file for complete search history.

(56) References Cited

U.S. PATENT DOCUMENTS

| | | | |
|---|---|---|---|
| 6,042,636 A * | 3/2000 | Aishima | B01D 53/70 95/219 |
| 6,107,198 A | 8/2000 | Lin et al. | |
| 6,485,534 B2 | 11/2002 | Quill | |
| 7,014,682 B2 | 3/2006 | Hickerson et al. | |
| 9,316,405 B2 | 4/2016 | Moon et al. | |
| 9,675,933 B2 | 6/2017 | Stuhler et al. | |
| 2003/0116080 A1* | 6/2003 | Huang | C30B 11/00 117/3 |
| 2008/0276801 A1* | 11/2008 | Bell | B01D 47/14 96/299 |
| 2009/0282858 A1* | 11/2009 | Demetri | F25B 9/004 62/401 |
| 2011/0020544 A1* | 1/2011 | Matsumoto | H01L 21/28556 118/723 R |
| 2012/0241535 A1* | 9/2012 | Carriere | A62C 31/05 239/425.5 |
| 2013/0236582 A1* | 9/2013 | Liu | B22F 9/08 425/7 |
| 2014/0048467 A1* | 2/2014 | Matsuura | C02F 1/48 210/243 |
| 2018/0051878 A1* | 2/2018 | Miyazaki | F23L 1/00 |
| 2018/0207651 A1* | 7/2018 | Meirav | B04C 3/04 |
| 2019/0083990 A1* | 3/2019 | Zhang | B01D 46/0032 |
| 2022/0071461 A1* | 3/2022 | Tung | B01D 47/10 |

FOREIGN PATENT DOCUMENTS

| | | |
|---|---|---|
| KR | 10-2004-0069102 | 8/2004 |
| KR | 10-2014-0120577 | 10/2014 |
| KR | 1918549 | 11/2018 |

* cited by examiner

APPARATUS TRAPPING AN EXHAUST MATERIAL FROM A SUBSTRATE-PROCESSING PROCESS AND APPARATUS FOR PROCESSING A SUBSTRATE INCLUDING THE TRAPPING APPARATUS

CROSS-REFERENCE TO RELATED APPLICATION

This application claims priority under 35 USC § 119 to Korean Patent Application No. 10-2021-0116935, filed on Sep. 2, 2021 in the Korean Intellectual Property Office (KIPO), the disclosure of which is incorporated by reference herein in its entirety.

TECHNICAL FIELD

Exemplary embodiments of the present inventive concept relate to an apparatus and a method of trapping an exhaust material from a substrate-processing process and apparatus for processing a substrate including the trapping apparatus. More particularly, exemplary embodiments of the present inventive concept relate to an apparatus and a method of trapping an exhaust gas discharged from a reaction chamber configured to process a semiconductor substrate, and an apparatus for processing a substrate including the trapping apparatus.

DISCUSSION OF THE RELATED ART

Generally, a reaction chamber for fabricating a semiconductor device may process a substrate using a reaction gas. Typically, an exhaust material may be discharged from the reaction chamber during a substrate-processing process. For example, the exhaust material may be discharged from the reaction chamber through an exhaust line with a vacuum provided from a vacuum pump.

According to related arts, a trapping apparatus such as a scrubber may generate a physical phase transition reaction of the exhaust material to form a powder. The powder may be accumulated on an inner surface of the exhaust line so that the exhaust line may become clogged. Thus, it may be required to periodically remove the powder from the exhaust line so that it may be unclogged or prevented from becoming clogged.

The powder removal from the exhaust line may be performed after stopping the reaction chamber. Thus, an operating ratio of the reaction chamber may be lowered and a decrease in a productivity of the semiconductor device may occur. Further, because the scrubber and the vacuum pump may be stopped, operational safety of the trapping apparatus may be reduced. Furthermore, there may be an increased probability of exposing a worker to the powder, which may result in a negligent accident.

In addition, the formation of the powder may be dependent upon the physical phase transition reaction. Thus, a component among components in the exhaust material, which may not belong to conditions of the physical phase transition reaction, might not be trapped.

SUMMARY

According to an exemplary embodiment of the present inventive concept, an apparatus for trapping an exhaust material from a substrate-processing process includes: a cyclone configured to provide the exhaust material with a swirling flow, wherein the exhaust material is discharged from the substrate-processing process using a reaction gas; an atomization module for providing the cyclone with a mist to convert the exhaust material into a powder through a wet oxidation reaction; and a collector configured to collect the powder.

According to an exemplary embodiment of the present inventive concept, an apparatus for processing a substrate includes: a reaction chamber configured to process the substrate by using a reaction gas; a vacuum pump configured to provide the reaction chamber with vacuum to discharge an exhaust material from the reaction chamber; a cyclone connected to the reaction chamber and the vacuum pump and configured to provide the exhaust material with a swirling flow; an atomization module providing the cyclone with a mist to convert the exhaust material into a powder through a wet oxidation reaction; and a collector configured to collect the powder from the cyclone.

According to an exemplary embodiment of the present inventive concept, a method of trapping an exhaust material from a substrate-processing process includes: providing the exhaust material with a mist such that the exhaust material is converted into a powder through a wet oxidation reaction, wherein the exhaust material is discharged from the substrate-processing process; and collecting the powder in a collector.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
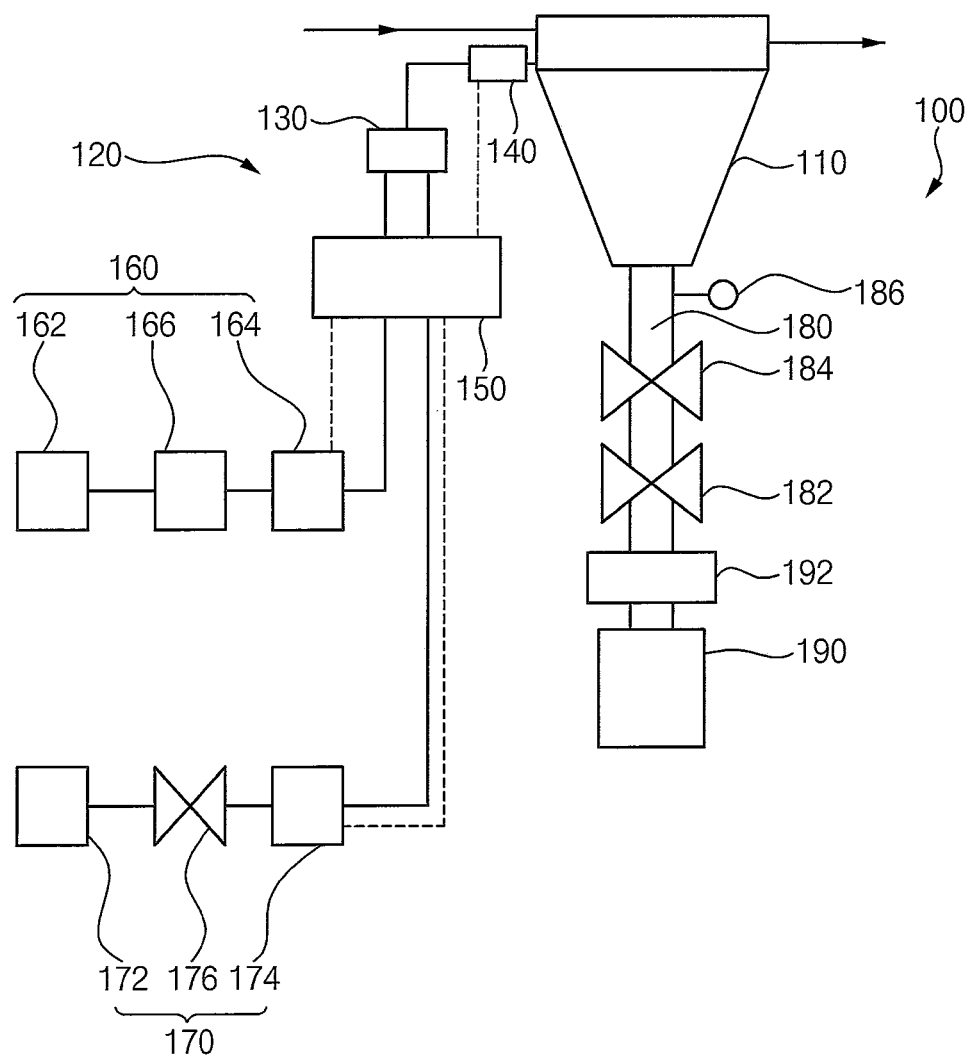
FIG. 1 is a view illustrating an apparatus for trapping an exhaust material from a substrate-processing process according to an exemplary embodiment of the present inventive concept.
Figure 2:
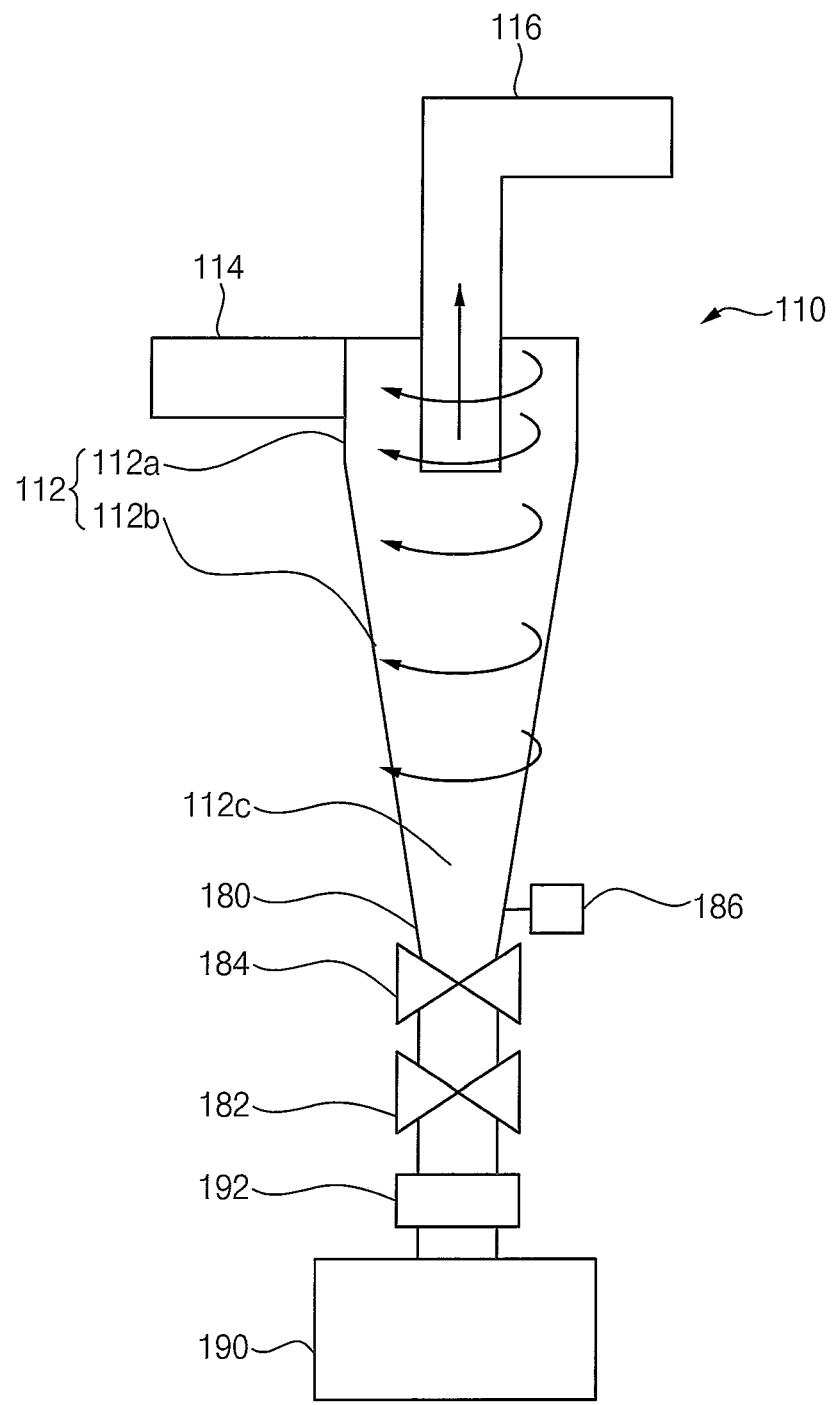
FIG. 2 is an enlarged view illustrating a cyclone and a collector of the trapping apparatus in FIG. 1.
Figure 3:
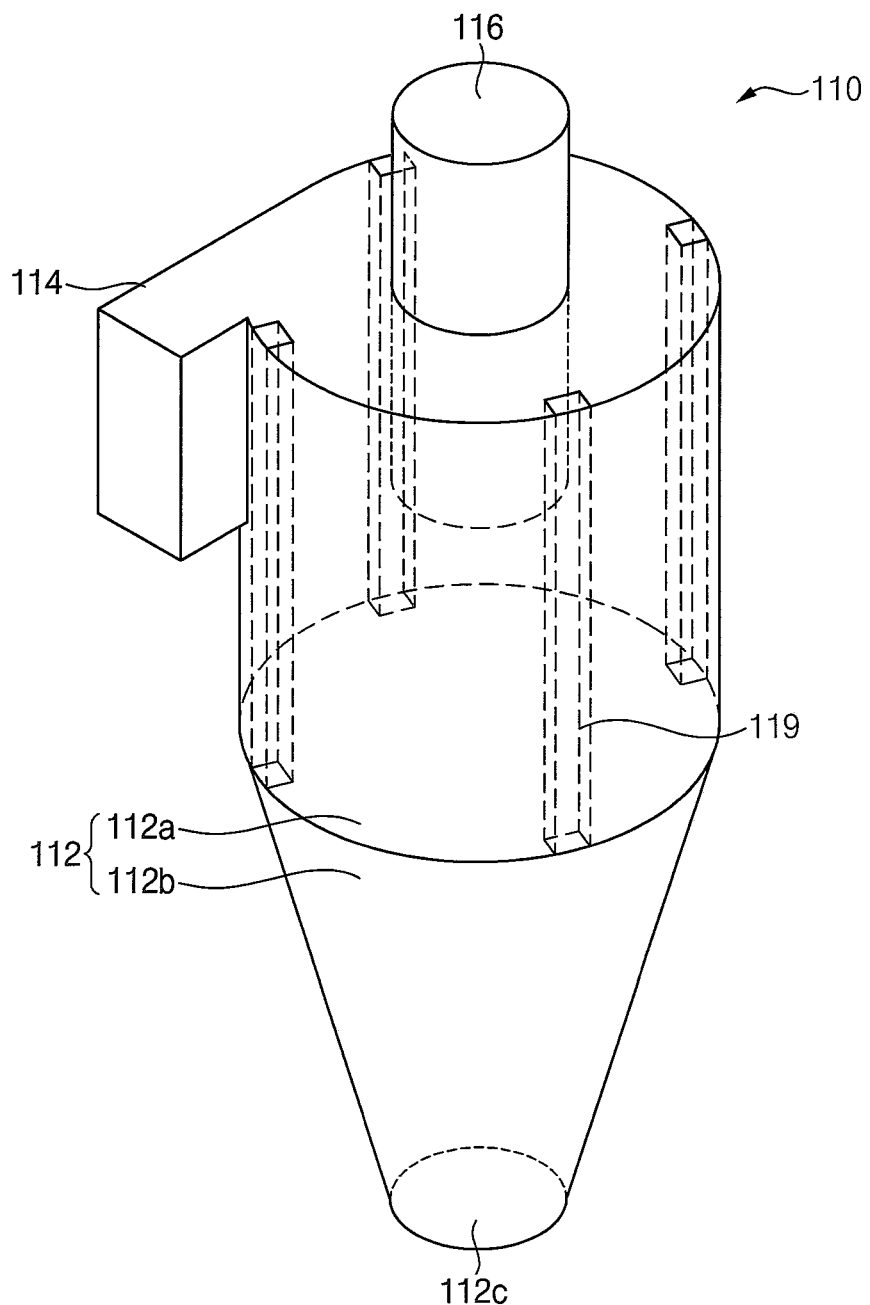
FIG. 3 is a perspective view illustrating an inner structure of the cyclone in FIG. 2.
Figure 4A:
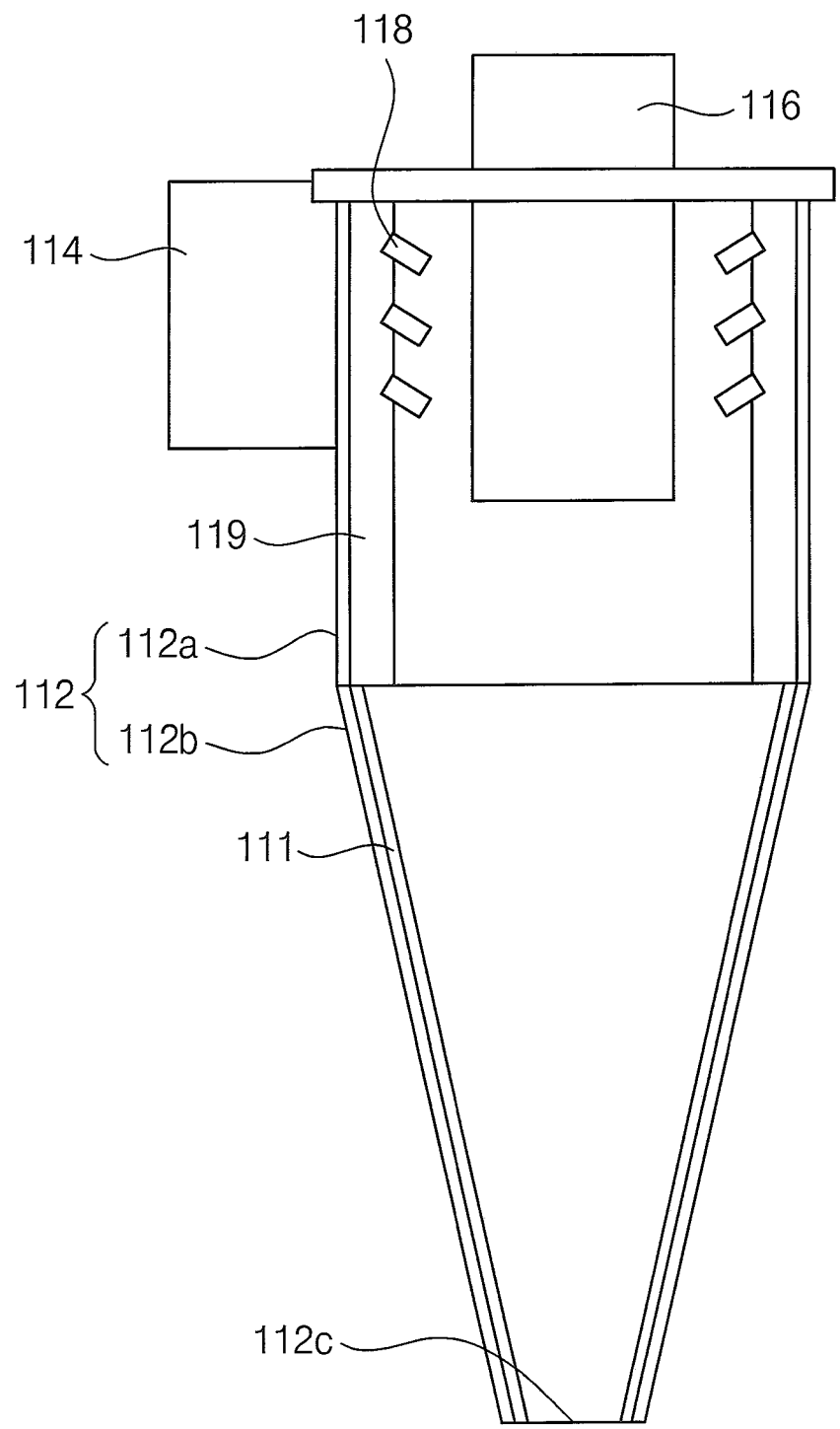
FIGS. 4A, 4B, and 4C are cross-sectional views illustrating the cyclone in FIG. 3.
Figure 4B:
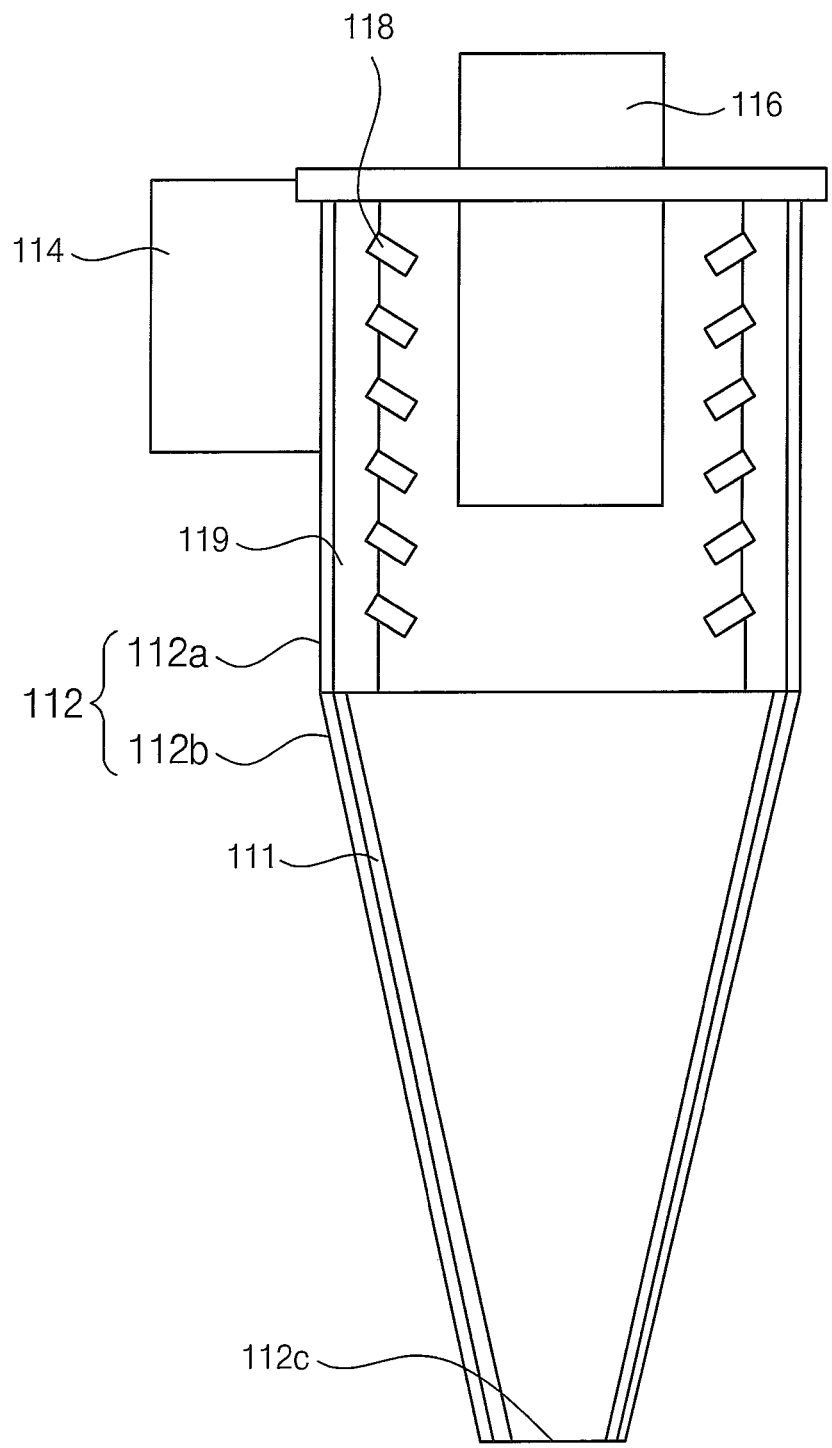
Figure 4C:
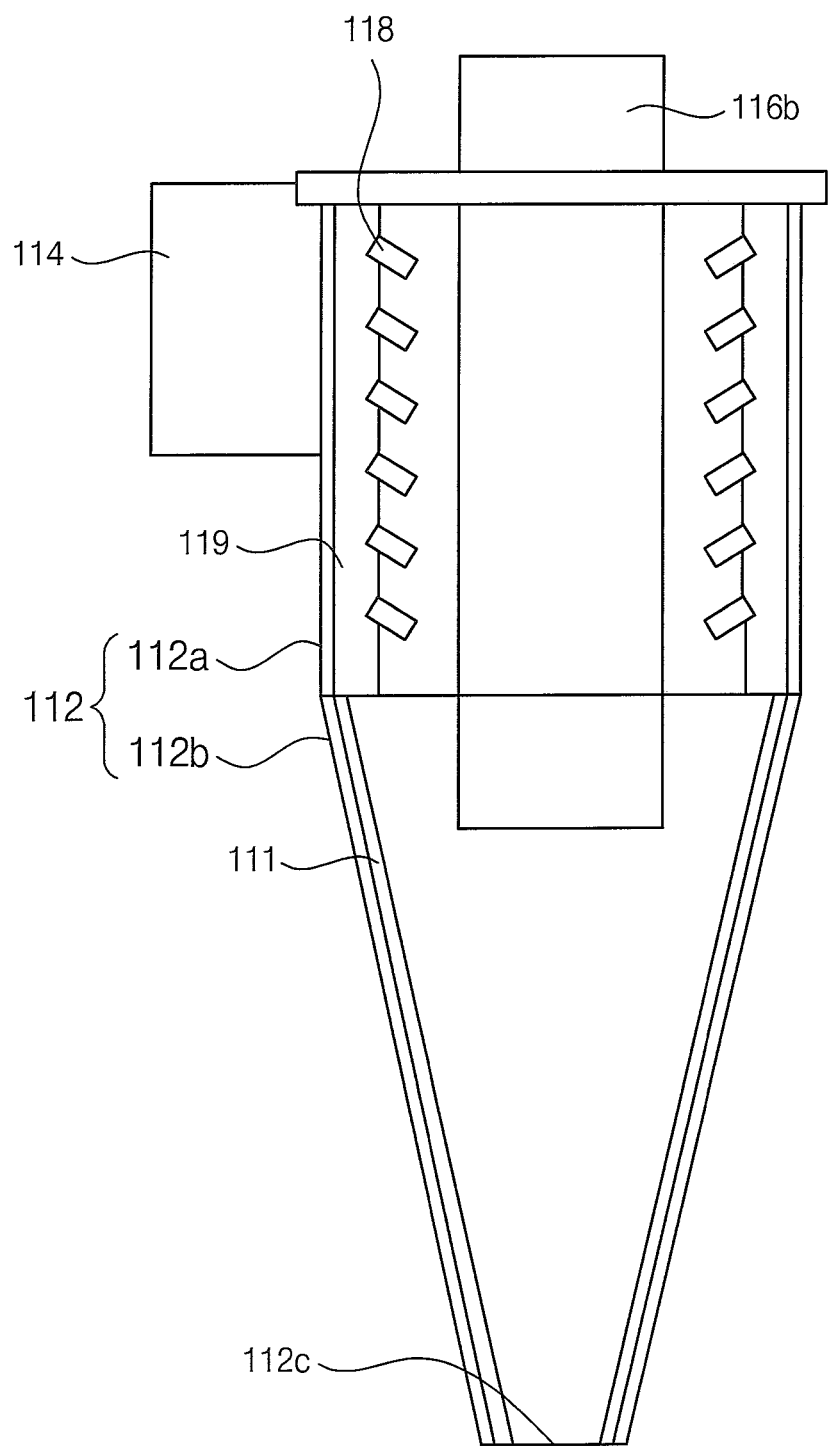
Figure 5:
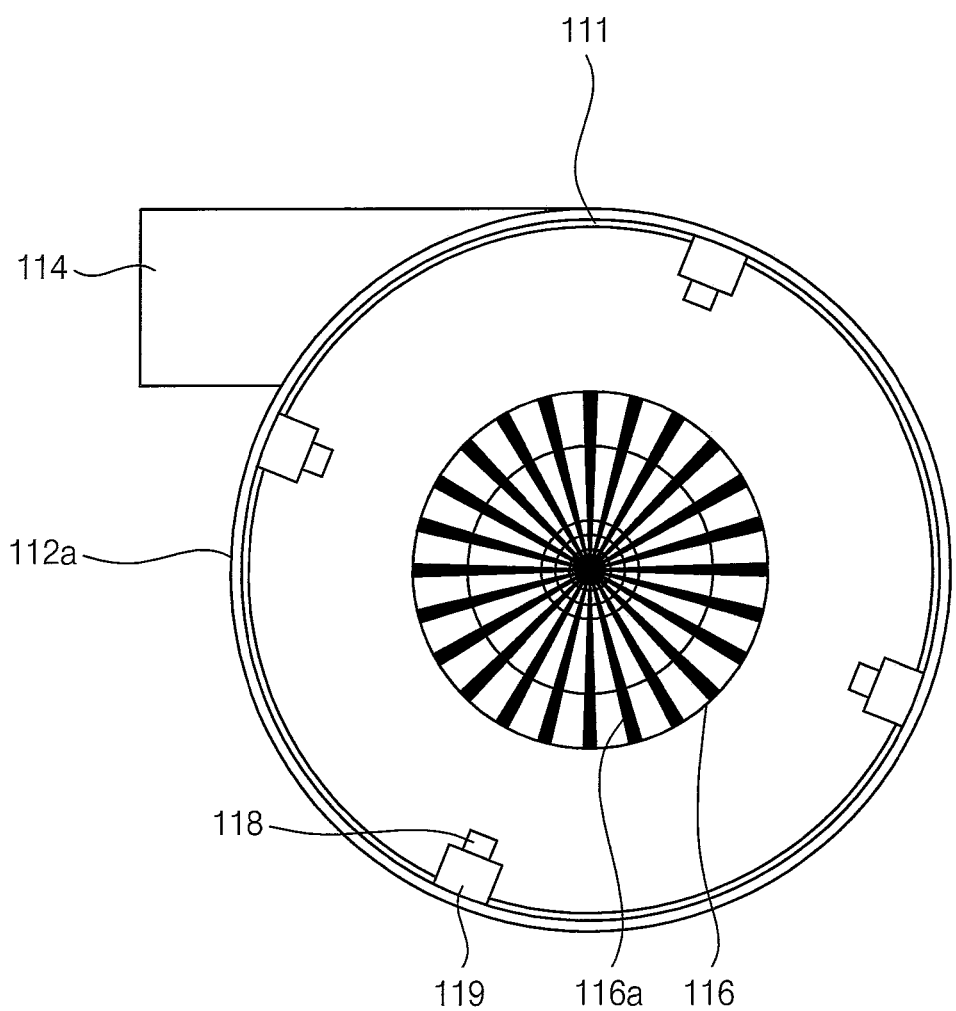
FIG. 5 is a plan view illustrating the cyclone in FIG. 3.

FIG. 1 is a view illustrating an apparatus for trapping an exhaust material from a substrate-processing process according to an exemplary embodiment of the present inventive concept. FIG. 2 is an enlarged view illustrating a cyclone and a collector of the trapping apparatus in FIG. 1. FIG. 3 is a perspective view illustrating an inner structure of the cyclone in FIG. 2. FIGS. 4A to 4C are cross-sectional views illustrating the cyclone in FIG. 3, and FIG. 5 is a plan view illustrating the cyclone in FIG. 3. In FIG. 1, a full line may indicate a fluid flow and a dotted line may indicate a control signal.

A trapping apparatus according to an exemplary embodiment of the present inventive concept may convert an exhaust material, which may be discharged from a substrate-processing process using a reaction gas (e.g., a reaction chamber), into a powder through a wet oxidation reaction. The trapping apparatus may then trap the powder. The exhaust material may include a non-reacted gas, which is among the reaction gas, non-reacted with a substrate, byproducts that are generated by a reaction between the reaction gas and the substrate, etc. For example, the non-reacted gas might not have reacted with the substrate. The trapping apparatus according to an exemplary embodiment of the present inventive concept may induce the wet oxidation reaction of the non-reacted gas to convert the non-reacted gas into the powder. However, the trapping apparatus according to an exemplary embodiment of the present inventive concept may be applied to the byproducts, which are not limited to the non-reacted gas. The substrate-processing process may include processes for manufacturing a semiconductor device using the reaction gas. For example, the substrate-processing process may include a deposition process, a diffusion process, an etching process, an ashing process, etc.

Referring to FIGS. 1 to 5, the trapping apparatus 100 according to an exemplary embodiment of the present inventive concept may include a cyclone 110, an atomization module 120 and a collector 190.

The cyclone 110 may be configured to receive the exhaust material discharged from the reaction chamber. The cyclone 110 (or, e.g., a funnel) may provide the exhaust material with a downwardly swirling flow to perform a centrifugation of components in the exhaust material. In an exemplary embodiment of the present inventive concept, the cyclone 110 may include a cyclone body 112, an inlet port 114, an outlet port 116 and a plurality of nozzles 118.

The cyclone body 112 may have an empty inner space configured to receive the exhaust material. The cyclone body 112 may include a cylindrical portion 112a and a circular conical portion 112b. The cylindrical portion 112a may be connected to the reaction chamber. The cylindrical portion 112a may have a closed upper surface. The circular conical portion 112b may be extended from a lower end of the cylindrical portion 112a. The circular conical portion 112b may have gradually decreased diameters toward a downward direction. For example, the diameter of the circular conical portion 112b may gradually decrease in the downward direction. An opening 112c may be formed at a lower end of the circular conical portion 112b.

A protection layer 11I may be coated on an inner surface of the cyclone body 112. The protection layer 111 may include, for example, a hydrophobic material having a chemical-resistance. The hydrophobic protection layer 11I may prevent the powder, which may be converted from the exhaust material by the wet oxidation reaction, from adhering to the inner surface of the cyclone body 112. Further, the hydrophobic protection layer 111 may protect the inner surface of the cyclone body 112 from a corrosive component in the exhaust material. In an exemplary embodiment of the present inventive concept, the protection layer 111 may include Teflon, polychlorotrifluoroethylene (CTFE), fluorinated ethylene propylene (FEP), perfluoroalkoxy alkane (PFA), etc.; however, the present inventive concept not limited thereto.

The inlet port 114 may be arranged at an upper portion of a side surface of the cyclone body 112. The inlet port 114 may be connected to the reaction chamber. Thus, the exhaust material may be introduced into the cyclone body 112 through the inlet port 114. For example, the inlet port 114 may be formed at the upper portion of the side surface of the cyclone body 112 along a tangential direction.

The outlet port 116 may vertically enter into the cyclone body 112 through a central portion of the upper surface of the cyclone body 112. For example, the outlet port 116 may have a lower end higher than the lower end of the cylindrical portion 112a. For example, a gap may be between the lower end of the outlet port 116 and the lower end of the cylindrical portion 112a. A residual gas, which may not be converted into the powder from the exhaust material, may be discharged through the outlet port 116. A filter 116a is configured to prevent a solid component in the exhaust material from being discharged through the outlet port 116, and may be arranged in the outlet port 116.

The nozzles 118 may be arranged on the inner surface of the cyclone body 112. The nozzles 118 may receive a mist from the atomization module 120. The nozzles 118 may inject the mist into the cyclone body 112. For example, the nozzles 118 may inject the mist to the exhaust material in the cyclone body 112 to induce the wet oxidation reaction of the exhaust material.

In the cyclone body 112, the exhaust material may be swirled around a center of the cyclone body 112. To uniformly inject the mist to the swirled exhaust material, the nozzles 118 may be horizontally spaced apart from each other by a gap. For example, the nozzles 118 may be horizontally spaced apart from each other by a gap in a central portion of the cyclone body 112. For example, nozzles 118 on the inner surface of the cyclone body 112 may be horizontally arranged to be spaced apart from each other by a uniform gap on a horizontal plane. As another example, each nozzle 118 may directly face an opposing nozzle 118.

Further, exhaust material may be downwardly swirled in the cyclone body 112. To more facilitate the wet oxidation reaction of the exhaust material, the nozzles 118 may be vertically spaced apart from each other by a gap. For example, the nozzles 118 may be vertically spaced apart from each other by a substantially uniform gap. The vertically arranged nozzles 118 may receive the mist through a mist passage 119 vertically formed along the inner surface of the cyclone body 112. For example, each of the nozzles 118 may be inclined in the downward direction to the center of the cyclone body 112. Thus, the mist from the nozzles 118 may be downwardly injected toward the center of the cyclone body 112.

In addition, the nozzles 118 may not be oriented toward the center of the cyclone body 112. For example, the nozzles 118 may be arranged in a direction slanted to a direction toward the center of the cyclone body 112. As another example, the nozzles 118 may be arranged in the swirling direction of the exhaust material or in a direction opposite to the swirling direction of the exhaust material. The nozzles 118 may be arranged along the horizontal direction.

Referring to FIG. 4B, the nozzles 118 may be vertically arranged on the entire inner surface of the cylindrical portion 112a of the cyclone body 112. At least one of the nozzles 118 may be positioned under the lower end of the outlet port 116 so that the mist may directly inject to a lower region of the cylindrical portion 112*a* under the outlet port 116. When an amount of the mist injected from the nozzles 118 may be too much, a part of the mist might not be involved in the wet oxidation reaction of the exhaust material. In this case, the part of the mist may be discharged through the outlet port 116. Because the outlet port 116 may be connected to a vacuum pump and a scrubber, moistures in the mist may damage the vacuum pump and the scrubber.

To prevent the damages of the vacuum pump and the scrubber, as shown in FIG. 4A, the nozzles 118 may be arranged on only an upper region of the inner surface of the cylindrical portion 112*a* of the cyclone body 112. For example, a lowermost nozzle 118 among the nozzles 118 may be positioned higher than the lower end of the outlet port 116. Thus, the mist might not be directly injected to the lower region under the outlet port 116. However, when an optimal amount of the mist injected from the nozzles 118 may be controlled so that most of the mist may be involved in the wet oxidation reaction of the exhaust material, it might not be required to limit the position of the nozzles 118 in FIG. 4A.

In addition, referring to FIG. 4C, the nozzles 118 may be vertically arranged on the inner surface of the cylindrical portion 112*a* of the cyclone body 112. An outlet port 116*b* may enter into the circular conical portion 112*b* and may pass through the lower end of the cylindrical portion 112*a*. Thus, the lowermost nozzle 118 of the plurality of nozzles 118 in the cylindrical portion 112*a* may be positioned higher than a lower end of the outlet port 116*b* in the circular conical portion 112*b*.

Figure 6:
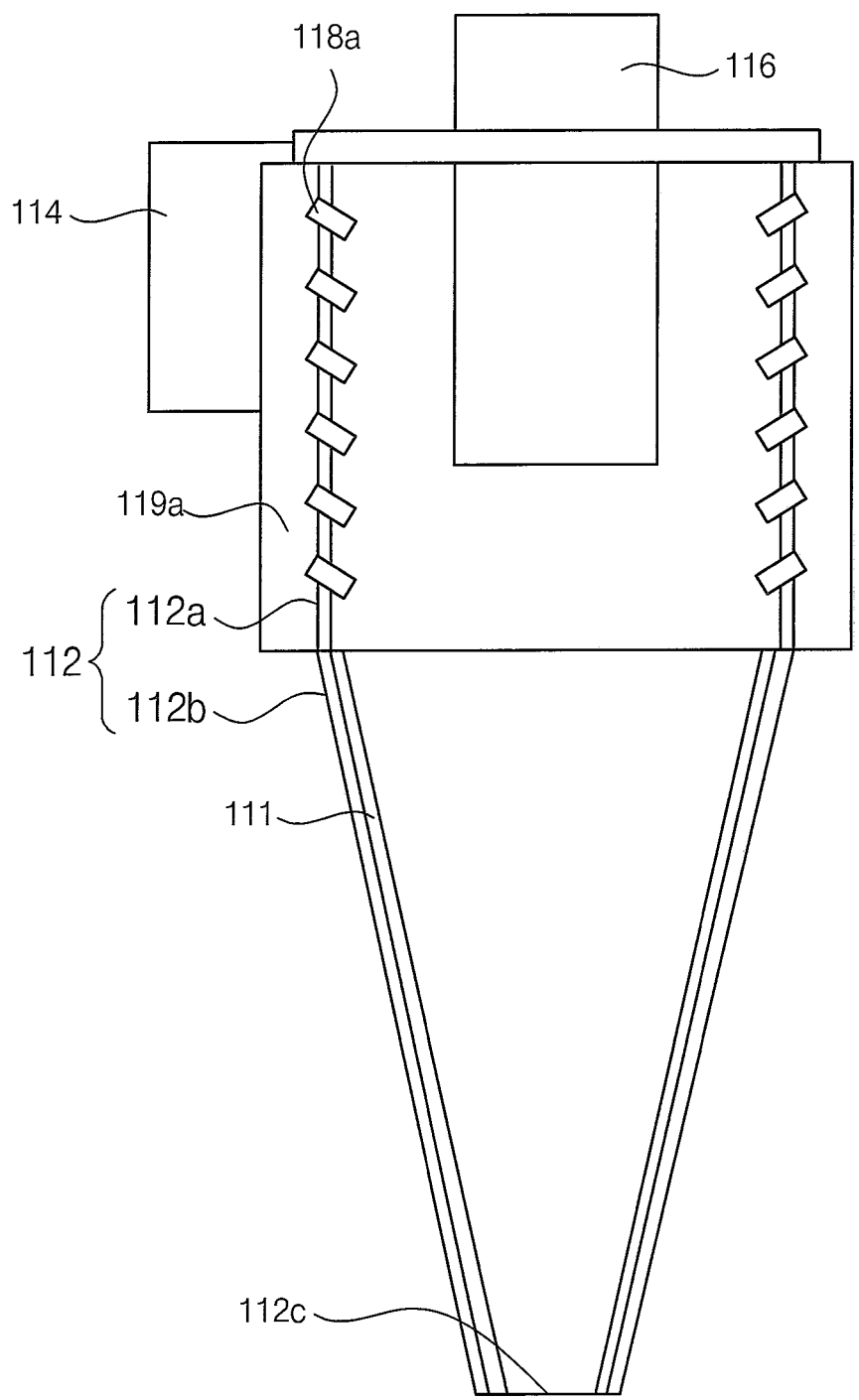
FIG. 6 is a cross-sectional view illustrating a cyclone in according to an exemplary embodiment of the present inventive concept.
Figure 7:
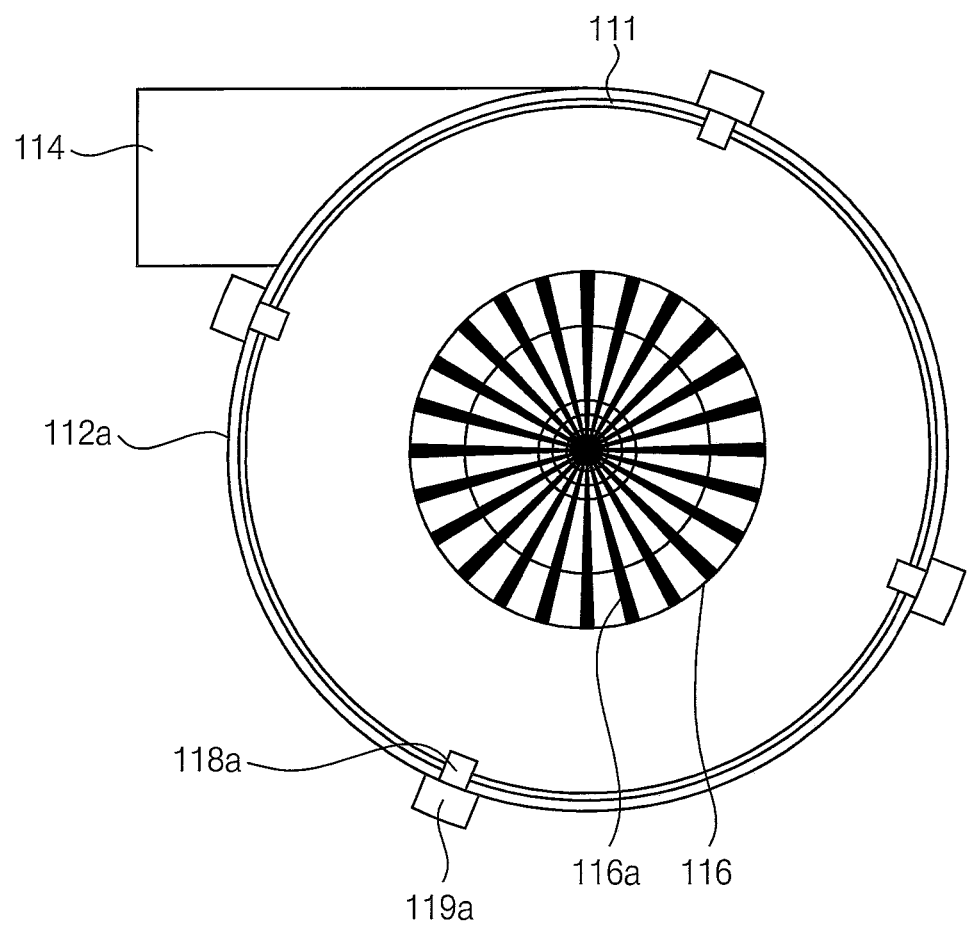
FIG. 7 is a plan view illustrating the cyclone in FIG. 6.

FIG. 6 is a cross-sectional view illustrating a cyclone according to an exemplary embodiment of the present inventive concept, and FIG. 7 is a plan view illustrating the cyclone in FIG. 6.

Referring to FIGS. 6 and 7, a mist passage 119*a* in an exemplary embodiment of the present inventive concept may be formed at an outer surface of the cyclone body 112. A plurality of nozzles 118*a* may enter into the cyclone body 112 through a wall of the cyclone body 112 from the mist passage 119*a*. Thus, a lower end of each of the nozzles 118*a* may be positioned in the cyclone body 112. For example, an upper end of each of the nozzles 118*a* may be positioned in the mist passage 119*a*. In addition, the lower end of the nozzle 118*a* might not protrude beyond the inner surface of the cyclone body 112.

Figure 8:
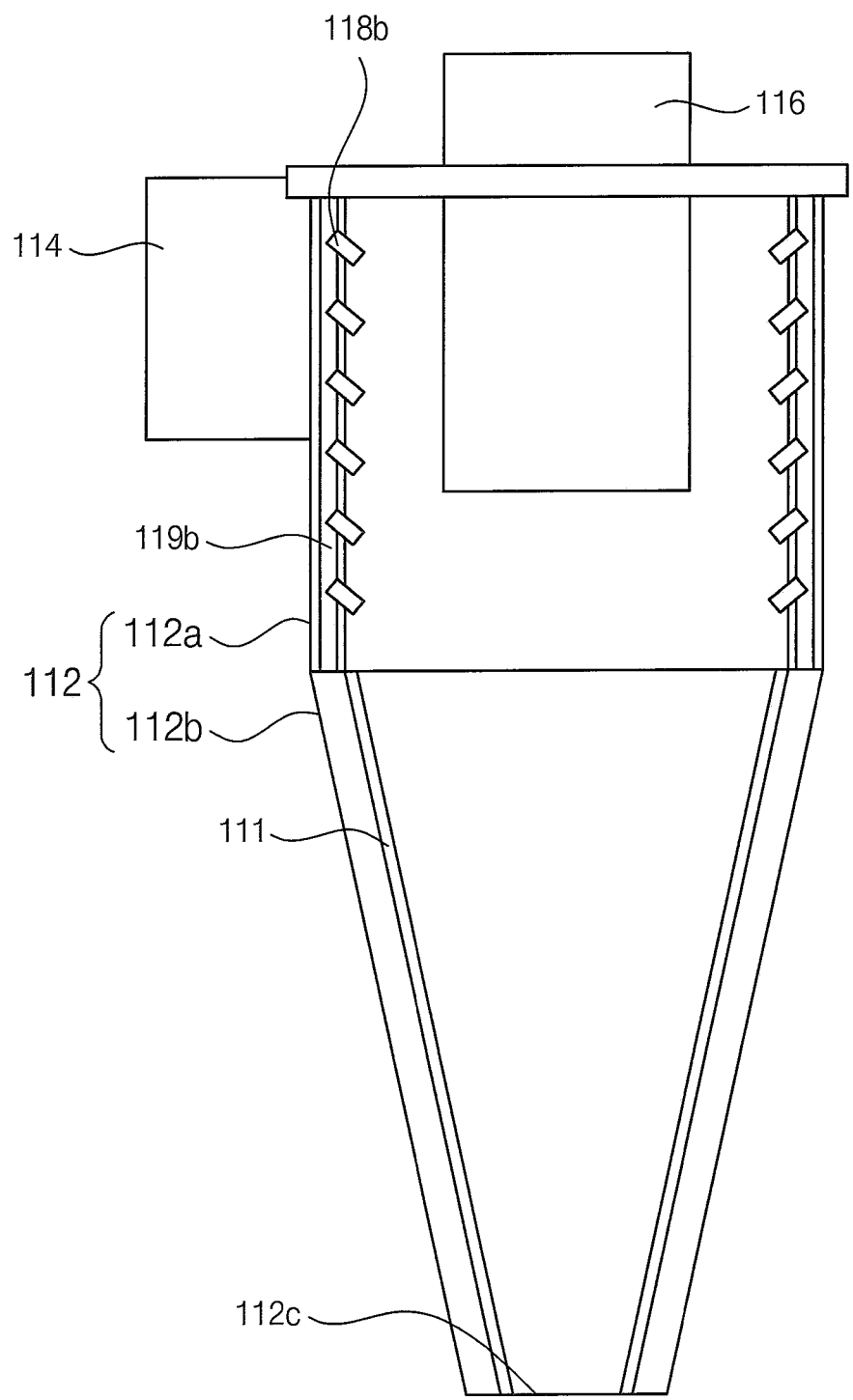
FIG. 8 is a cross-sectional view illustrating a cyclone according to an exemplary embodiment of the present inventive concept.
Figure 9:
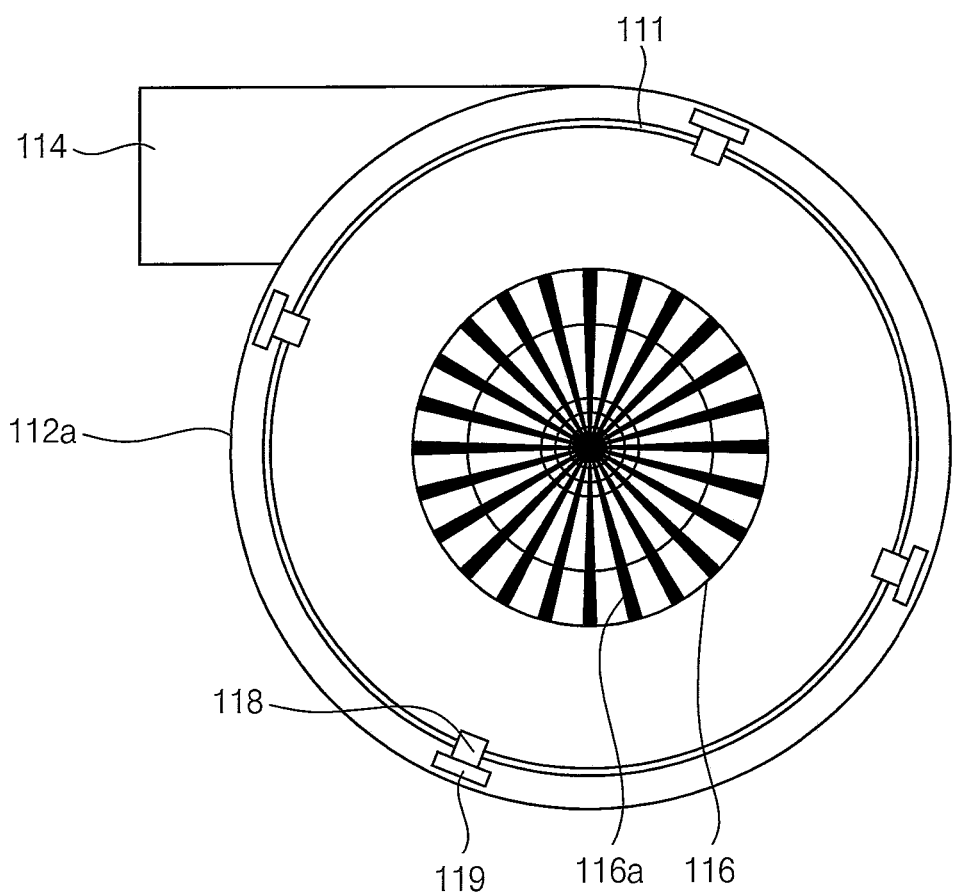
FIG. 9 is a plan view illustrating the cyclone in FIG. 8.

FIG. 8 is a cross-sectional view illustrating a cyclone according to an exemplary embodiment of the present inventive concept, and FIG. 9 is a plan view illustrating the cyclone in FIG. 8.

Referring to FIGS. 8 and 9, a mist passage 119*b* of the cyclone 110 according to an exemplary embodiment of the present inventive concept may be formed in a wall of the cyclone body 112. For example, the mist passage 119*b* may be vertically extended in the wall of the cyclone body 112. For example, the mist passage 119*b* may be formed in the wall of the cylindrical portion 112*a*. A plurality of nozzles 118*b* may be extended from the mist passage 119*b* into the cyclone body 112. In addition, a lower end of the nozzle 118*b* might not protrude beyond the inner surface of the cyclone body 112.

Referring again to FIG. 1, the atomization module 120 may be configured to provide the cyclone 110 with the mist. The atomization module 120 may include an atomizer 130, a water supply module 160, a compressed gas supply module 170, a density transmitter 140 and a density controller 150.

The water supply module 160 may be configured to supply water to the atomizer 130. The compressed gas supply module 170 may be configured to supply a compressed gas to the atomizer 130. The atomizer 130 may form the mist from the water and the compressed gas. The atomizer 130 may provide the cyclone 110 with the mist. For example, the atomizer 130 may supply the mist to the nozzles 118.

The water supply module 160 may include a water tank 162, a flow transmitter 164 and a pump 166. The water tank 162 may be configured to store the water. The flow transmitter 164 may be arranged between the water tank 162 and the atomizer 130 to measure a flux of the water supplied to the atomizer 130 from the water tank 162. The pump 166 may be arranged between the water tank 162 and the flow transmitter 164 to forcibly pump the water from the water tank 162 to the atomizer 130. However, when the water in the water tank 162 has pressure supplied to the atomizer 130, the water supply module 160 might not include the pump 166.

The compressed gas supply module 170 may include a gas tank 172, a pressure regulator 174 and a valve 176. The gas tank 172 may be configured to store the compressed gas. The pressure regulator 174 may measure a pressure of the compressed gas supplied from the gas tank 172 to the atomizer 130. The valve 176 may be configured to control a flow of the compressed gas supplied from the gas tank 172 to the atomizer 130. In an exemplary embodiment of the present inventive concept, the compressed gas may include air and/or an inert gas. The inert gas may include, for example, nitrogen, argon, etc., but the present inventive concept not limited thereto.

The density transmitter 140 may be arranged between the atomizer 130 and the cyclone 110. The density transmitter 140 may measure a density of the mist generated from the atomizer 130.

The density controller 150 may be arranged between the water supply module 160 and the atomizer 130 and between the compressed gas supply module 170 and the atomizer 130. Thus, the water from the water supply module 160 and the compressed gas from the compressed gas supply module 170 may be supplied to the atomizer 130 through the density controller 150. Mist data including data of the flux of the water measured by the flow transmitter 164, data of the pressure of the compressed gas measured by the pressure regulator 174, data of the density of the mist measured by the density transmitter 140 may be transmitted to the density controller 150. The density controller 150 may control the density of the mist generated from the atomizer 130 in accordance with the mist data.

The collector 190 may be connected with the lower end of the cyclone 110 via a trapping pipe 180. In addition, the trapping pipe 180 may be integrally formed with the lower end of the cyclone body 112; however, the present inventive concept is not limited thereto.

The powder converted from the exhaust material by the wet oxidation reaction may be collected in the collector 190 through the trapping pipe 180. For example, the collector 190 may be connected to a lower end of the trapping pipe 180 and may be detachable from the lower end of the trapping pipe 180. For example, the collector 190 may be detachably connected to the lower end of the trapping pipe 180 via a pipe coupler 192. However, the collector 190 and the trapping pipe 180 may be connected with each other by other detachable type connection structures, and the present inventive concept is not limited to the pipe coupler 192. In addition, the collector 190 may be directly and detachably connected to the lower end of the cyclone 110.

A gate valve 182 may be installed on the trapping pipe 180. The gate valve 182 may be configured to open and close the trapping pipe 180. In addition, other valves configured to open and close the trapping valve 180 may be used in place of the gate valve 182.

To remove the powder in the collector 190, the gate valve 182 may be closed. The collector 190 may be detached from the trapping pipe 180 using the pipe coupler 192. After removing the powder in the collector 190, the collector 190 may then be connected to the lower end of the trapping pipe 180 using the pipe coupler 192.

A swing gate 184 may be arranged between the lower end of the cyclone 110 and the gate valve 182. The swing gate 184 may prevent a backward flow of the powder in the collector 190 toward the cyclone 110 through the trapping pipe 180. In addition, other valves configured to prevent the backward flow of the powder may be used in place of the swing gate 184.

A pressure gauge 186 may be installed on the trapping pipe 180. The pressure gauge 186 may measure a pressure in the trapping pipe 180 to check if a leak is present in the trapping pipe 180.

In an exemplary embodiment of the present inventive concept, the operation for providing the exhaust material with the mist to form the powder and the operation for collecting the powder in the collector 190 may be performed during processing of the substrate in the reaction chamber in real time.

For example, when the collector 190 is fully filled with the powder so that the collector 190 may not collect additional powder, the gate valve 182 may be closed. The collector 190 may be detached from the trapping pipe 180. The powder in the collector 190 may then be removed. Because the gate valve 182 may be closed, an inner pressure of the reaction chamber connected to the cyclone 110, for example, the vacuum may be maintained. Thus, the operation for removing the powder in the collector 190 may be performed during processing of the substrate in the reaction chamber in real time without stopping the reaction chamber. Further, the operation for providing the exhaust material with the mist to form the powder may be performed regardless of the operation for removing the powder in the collector 190. The powder generated while collector 190 is detached from the trapping pipe 180, may be collected in the trapping pipe 180. Thus, when the collector 190 is connected to the trapping pipe 180 and the gate valve 182 is then be opened, the powder in the trapping pipe 180 may be collected in the collector 190.

Figure 10:
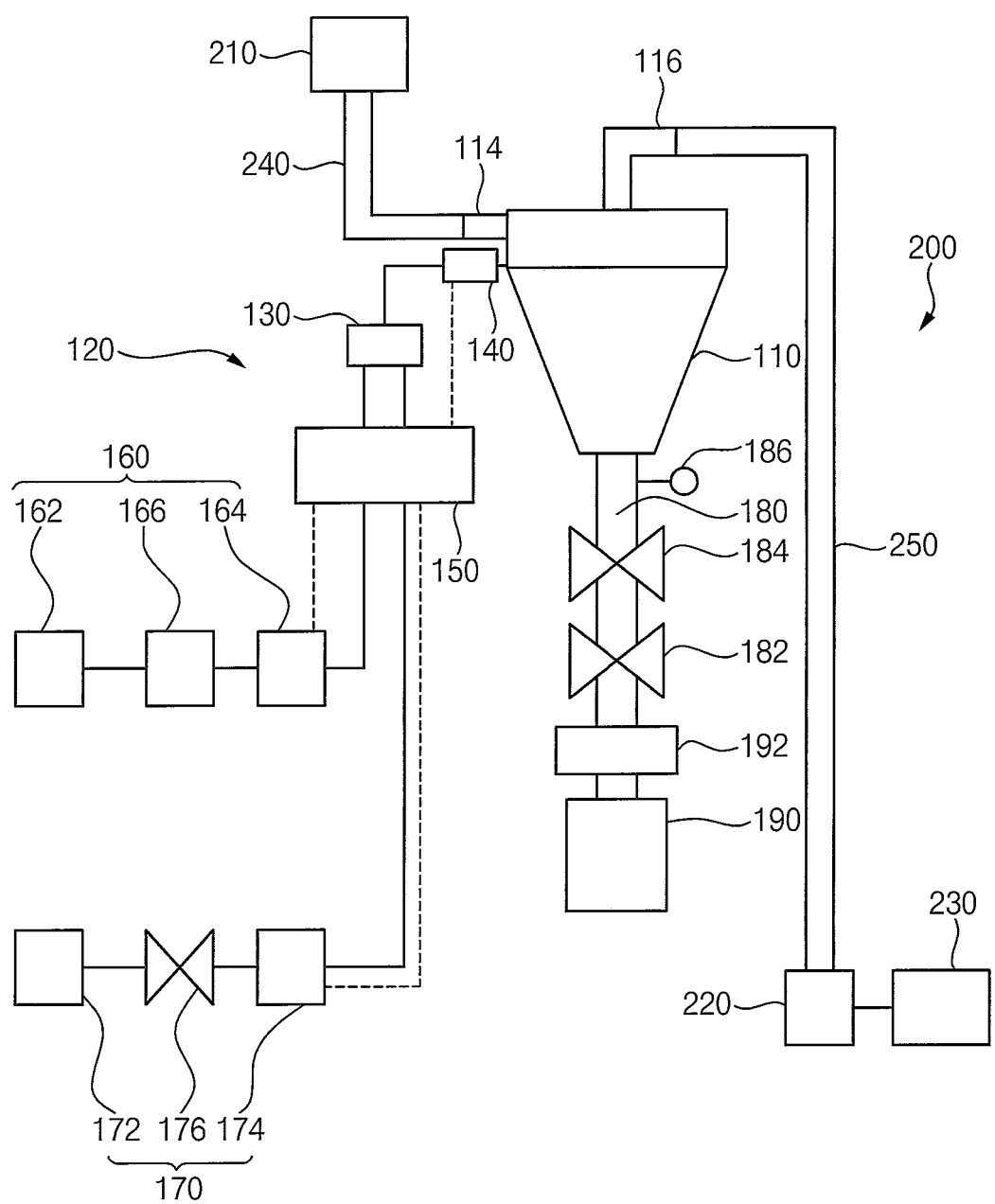
FIG. 10 is a view illustrating an apparatus for processing a substrate including the trapping apparatus in FIG. 1.

FIG. 10 is a view illustrating an apparatus for processing a substrate including the trapping apparatus in FIG. 1. In FIG. 10, a full line may indicate a fluid flow and a dotted line may indicate a control signal.

Referring to FIG. 10, a substrate-processing apparatus 200 according to an exemplary embodiment of the present inventive concept may include a reaction chamber 210, the trapping apparatus 100, a vacuum pump 220 and a scrubber 230. The trapping apparatus 100 may include the elements in FIG. 1. Thus, any further descriptions with respect to the trapping apparatus 100 that may be assumed to be redundant may be omitted herein for brevity. In addition, like reference numerals may refer to like elements, and thus repetitive descriptions may be omitted.

The reaction chamber 210 may be connected with the trapping apparatus 100 through a first vacuum line 240. The trapping apparatus 100 may be connected with the vacuum pump 220 through a second vacuum line 250. Thus, the vacuum pump 220 may provide the reaction chamber 210 with the vacuum through the trapping apparatus 100.

The first vacuum line 240 may be connected to the cyclone 110 of the trapping apparatus 100. For example, the first vacuum line 240 may be connected to the inlet port 114 of the cyclone 110. The second vacuum line 250 may be connected to the cyclone 110 of the trapping apparatus 100. For example, the second vacuum line 250 may be connected to the outlet port 116 of the cyclone 110. Thus, the vacuum generated from the vacuum pump 220 may be introduced into the cyclone 110 through the second vacuum line 250 and the outlet port 116. The vacuum in the cyclone 110 may be introduced into the reaction chamber 210 through the inlet port 114 and the first vacuum line 240.

The reaction chamber 210 may be configured to process the substrate using the reaction gas. For example, the reaction chamber 210 may include a deposition chamber, a diffusion chamber, an etching chamber, an ashing chamber, etc.

For example, when the reaction chamber 210 includes the deposition chamber, a layer may be deposited on the substrate using a deposition gas in the reaction chamber 210. For example, to deposit a TiN layer, the deposition gas introduced into the reaction chamber 210 may include $TiCl_4$, $NH_3$, $4ClF_3$, etc. A tiny part of the deposition gas may react with the substrate to form the TiN layer on the substrate. In addition, most of the deposition gas might not react with the substrate. Most of the deposition gas may be discharged from the reaction chamber 210.

For example, a gas discharged from the reaction chamber 210 may have following chemical reactions in a pipe between the reaction chamber 210 and the vacuum pump 220.

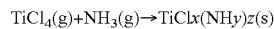

$$TiCl_4(g)+NH_3(g) \rightarrow TiClx(NHy)z(s)$$

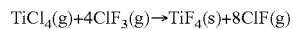

$$TiCl_4(g)+4ClF_3(g) \rightarrow TiF_4(s)+8ClF(g)$$

It can be noted that solid byproducts such as TiClx(NHy)z, $TiF_4$, etc., may be formed in the pipe from the above chemical reactions. The solid byproducts may be accumulated on the inner surface of the pipe to clog the pipe.

Here, the solid byproducts configured to clog the pipe may be generated from the gaseous $TiCl_4$. For example, $TiCl_4$ may be a main ingredient for generating the solid byproducts in the pipe.

The trapping apparatus 100 may trap $TiCl_4$ using the wet oxidation reaction. For example, when $TiCl_4$ may be introduced into the cyclone 110, the atomization module 120 may inject the mist to $TiCl_4$. $TiCl_4$ and the mist may have a following wet oxidation reaction.

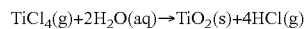

$$TiCl_4(g)+2H_2O(aq) \rightarrow TiO_2(s)+4HCl(g)$$

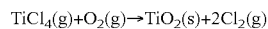

$$TiCl_4(g)+O_2(g) \rightarrow TiO_2(s)+2Cl_2(g)$$

$TiCl_4$ may be converted into a solid $TiO_2$ by the wet oxidation reaction. For example, it can be noted that $TiCl_4$ which may be the main ingredient for generating the solid byproducts, among the gases discharged from the reaction chamber 210 may be converted into the powder-shaped $TiO_2$ by the wet oxidation reaction.

The wet oxidation reaction may be readily generated at about a room temperature. When $TiCl_4$ may be reacted with the moisture in the mist, heat of about 279 KJ/mol may be generated from the reaction. Further, when $TiCl_4$ may be reacted with oxygen, heat of about 182 KJ/mol may be generated from the reaction. When a maximum residence time of the exhaust material in the cyclone 110 may be about 10 seconds, the wet oxidation reaction may be generated at a temperature of about 31° C. to about 38.5° C.

For example, when the reaction gas includes a halogen metal compound such as $WF_6$, $CuCl_2$, etc., the halogen metal compound may be converted into a powder through following wet oxidation reactions.

$$WF_6 + 3H_2O \rightarrow WO_3 + 6HF$$

$$CuCl_2 + 2H_2O \rightarrow Cu(H_2O)_2Cl_2$$

For example, when the reaction gas includes DCS ($SiH_2Cl_2$, dichlorosilane), $NH_3$, $NH_4Cl$ as byproducts may be generated. $SiH_2Cl_2$ and $NH_4Cl$ may be converted into a powder through following wet oxidation reactions.

$$NH_4Cl(s) \rightarrow NH_4Cl(aq) \rightarrow NH_4^+(aq) + Cl^-(aq)$$

$$SiH_2Cl_2 + H_2O \rightarrow [H_2SiO]_n + HCl$$

According to an exemplary embodiment of the present inventive concept, the trapping apparatus may convert the main ingredient, which may generate the solid byproducts and is among the exhaust material discharged in the deposition process, into the solid powder by the wet oxidation reaction. For example, the exhaust material may be converted into the powder by the wet oxidation reaction regardless of phase transition conditions of the exhaust material.

The functions of the trapping apparatus may be applied to the diffusion process, the etching process, the ashing process, etc., to convert a main ingredient, which may generate the solid byproducts, into a solid powder by the wet oxidation reaction. The main ingredient is among the exhaust material discharged in the diffusion process, the etching process, the ashing process, etc.

The powder may be collected in the collector 190 through the trapping pipe 180. For example, the operation for providing the exhaust material with the mist to form the powder and the operation for collecting the powder in the collector 190 may be performed in real time during processing of the substrate.

The powder, which may be generated by the wet oxidation reaction in real time during processing of the substrate in the reaction chamber 210, may be continuously collected in the collector 190. When the collector 190 is fully filled with the powder, the gate valve 182 may be closed. The collector 190 may be detached from the trapping pipe 180. The powder in the collector 190 may then be removed. Because the gate valve 182 may be closed, the inner pressure of the reaction chamber 210 connected to the cyclone 110, for example, the vacuum may be maintained. Thus, the operation for removing the powder in the collector 190 may be performed in real time during processing of the substrate without the stopping of the reaction chamber 210.

In addition, the residual gas, which may not be converted into the powder, among the exhaust material may be discharged through the outlet port 116. Because the vacuum pump 220 may provide the cyclone 110 with the vacuum, the residual gas may be discharged through the outlet port 116 and the second vacuum line 250.

The scrubber 230 may be connected to the second vacuum line 250. For example, the scrubber 230 may connected to the second vacuum line 250 through the vacuum pump 220. However, the present inventive concept is not limited thereto. For example, the scrubber 230 may be directly connected to the second vacuum line 250. The scrubber 230 may trap the residual gas discharged through the second vacuum line 250.

Figure 11:
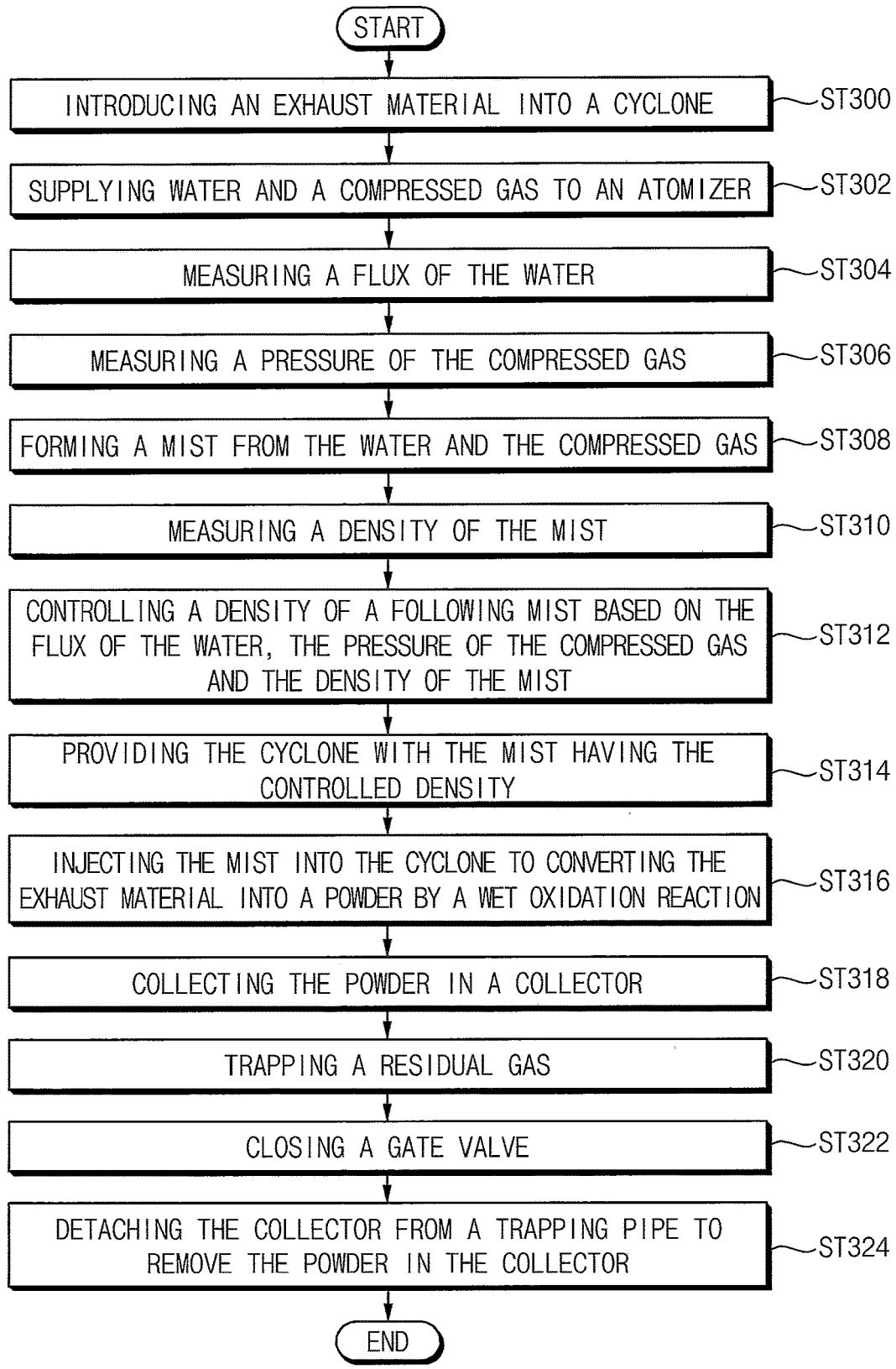
FIG. 11 is a flow chart illustrating a method of trapping an exhaust material from a substrate-processing process using the trapping apparatus in FIG. 1.

FIG. 11 is a flow chart illustrating a method of trapping an exhaust material from a substrate-processing process using the trapping apparatus in FIG. 1.

Referring to FIGS. 1, 10 and 11, in step ST300, the exhaust material discharged from the reaction chamber 210 may be introduced into the cyclone 110. The exhaust material may be downwardly swirled in the cyclone 110.

In step ST302, the water supply module 160 may supply the water to the atomizer 130 through the density controller 150. Further, the compressed gas supply module 170 may supply the compressed gas to the atomizer 130 through the density controller 150.

In step ST304, the flow transmitter 164 may measure the flux of the water. The measured flux of the water may then be transmitted to the density controller 150.

In step ST306, the pressure regulator 174 may measure the pressure of the compressed gas. The measured pressure of the compressed gas may then be transmitted to the density controller 150.

In step ST308, the atomizer 130 may form the mist from the water and the compressed gas.

In step ST310, the density transmitter 140 may measure the density of the mist formed by the atomizer 130. The measured density of the mist may then be transmitted to the density controller 150.

In step ST312, the density controller 150 may control a density of a mist (e.g., a following mist) formed in the atomizer 130 based on the flux of the water, the pressure of the compressed gas, the density of the mist, etc. For example, the following mist may be a mist generated after the flux of the water, the pressure of the compressed gas, the density of the mist have been measured.

In step ST314, the mist having the density controlled by the density controller 150 may be supplied to the nozzles 118 of the cyclone 110.

In step ST316, the nozzles 118 may inject the mist into the cyclone 110 to generate the wet oxidation reaction between the exhaust material and the mist. The exhaust material may then be converted into the powder by the wet oxidation reaction.

In step ST318, the powder may be collected in the collector 190 through the trapping pipe 180.

In step ST320, the residual gas, which may not be converted into the powder, among the exhaust gas may be discharged through the outlet port 116. The scrubber 230 may trap the residual gas. For example, the scrubber 230 may be connected to the outlet port 116 through the second vacuum line 250 and the vacuum pump 220.

In an exemplary embodiment of the present inventive concept, the step for providing the exhaust material with the mist to form the powder and the step for collecting the powder in the collector 190 may be performed in real time during processing of the substrate.

In step ST322, when the collector 190 is fully filled with the powder so that the collector 190 may not collect the powder any more, the gate valve 182 may be closed.

In step ST324, the collector 190 may be detached from the trapping pipe 180. The powder in the collector 190 may then be removed. Because the gate valve 182 may be closed, the inner pressure of the reaction chamber 210 connected to the cyclone 110 may be maintained. Thus, the operation for removing the powder in the collector 190 may be performed in real time during processing of the substrate in the reaction chamber 210 without the stopping of the reaction chamber 210.

According to an exemplary embodiment of the present inventive concept, the mist may be provided to the exhaust material discharged from the substrate-processing process to generate the wet oxidation reaction between the exhaust material and the mist. Thus, the exhaust material may be changed into the powder regardless of phase transition conditions of the exhaust material. As a result, trapping efficiency of the exhaust material may be increased.

Further, in an exemplary embodiment of the present inventive concept, the operation for providing the exhaust material with the mist to form the powder and the operation for collecting the powder in the collector may be performed in real time during processing of the substrate. Thus, a productivity of a semiconductor device may be increased by increasing an operating ratio of the reaction chamber. Therefore, it might not be required to stop the scrubber and the vacuum pump so that operational safety of the trapping apparatus may also be increased. Furthermore, a negligent accident may be prevented because a worker might not be exposed to the powder.

The foregoing is illustrative of exemplary embodiments of the present inventive concept and is not to be construed as limiting of the present inventive concept. Although a few exemplary embodiments of the present inventive concept have been described, those of ordinary skill in the art will readily appreciate and understand that various modifications and changes in form and details may be made to the exemplary embodiments of the present inventive concept without materially departing from the spirit and scope of the present inventive concept. Accordingly, all such modifications and changes are intended to be included within the spirit and scope of the present inventive concept. In the claims, means-plus-function clauses are intended to cover the structures described herein as performing the recited function and not only structural equivalents but also equivalent structures. Therefore, it is to be understood that the foregoing is illustrative of exemplary embodiments of the present inventive concept and is not to be construed as being limited to the specific exemplary embodiments disclosed, and that modifications to the disclosed exemplary embodiments, as well as other exemplary embodiments, are intended to be included within the spirit and scope of the present inventive concept.

What is claimed is:

1. An apparatus for trapping an exhaust material from a substrate-processing process, the apparatus comprising:
    a cyclone configured to provide the exhaust material with a swirling flow, wherein the exhaust material is discharged from the substrate-processing process using a reaction gas;
    an atomization module for providing the cyclone with a mist to convert the exhaust material into a powder through a wet oxidation reaction; and
    a collector configured to collect the powder,
    wherein the atomization module includes:
    an atomizer configured to form the mist;
    a water supply module configured to supply water to the atomizer and to measure a flux of the water supplied to the atomizer;
    a compressed gas supply module configured to supply a compressed gas to the atomizer and to measure a pressure of the compressed gas supplied to the atomizer;
    a density transmitter configured to measure a density of the mist provided from the atomizer to the cyclone; and
    a density controller configured to control the density of the mist formed by the atomizer based on data of the flux of water that received from the water supply module, data of pressure of compressed gas that is received from the compressed gas supply module, and data of the density of the mist that is received from the density transmitter.

2. The apparatus of claim 1, wherein the cyclone comprises:
    a cyclone body configured to provide the exhaust material with the swirling flow, wherein the cyclone body includes an opened lower end through which the powder passes;
    an inlet port connected to a side surface of the cyclone body and configured to introduce the exhaust material into the cyclone body;
    an outlet port entering into the cyclone body and configured to discharge a residual gas, which is not converted into the powder, among the exhaust material; and
    a first nozzle arranged on an inner surface of the cyclone body and configured to inject the mist provided from the atomization module into the cyclone body.

3. The apparatus of claim 2, wherein the cyclone further comprises a hydrophobic protection layer coated on the inner surface of the cyclone body.

4. The apparatus of claim 3, wherein the protection layer comprises Teflon, polychlorotrifluoroethylene (CTFE), fluorinated ethylene propylene (FEP) or perfluoroalkoxy alkane (PFA).

5. The apparatus of claim 2, wherein the cyclone body comprises:
    a cylindrical portion connected to the inlet port and the outlet port, and
    a circular conical portion connected to the cylindrical portion and the collector.

6. The apparatus of claim 5, wherein the first nozzle has a lower end positioned in the cylindrical portion.

7. The apparatus of claim 6, wherein the lower end of the first nozzle is positioned higher than a lower end of the outlet port.

8. The apparatus of claim 6, wherein the outlet port passes through the cylindrical portion and has a lower end positioned in the circular conical portion.

9. The apparatus of claim 6, wherein the outlet port has a lower end positioned in the cylindrical portion.

10. The apparatus of claim 2, wherein the first nozzle is of a plurality of nozzles arranged in at least one of a vertical direction or a horizontal direction.

11. The apparatus of claim 1, wherein the water supply module comprises:
    a water tank configured to store the water; and
    a flow transmitter configured to measure the flux of the water supplied from the water tank to the atomizer.

12. The apparatus of claim 11, wherein the water supply module further comprises a pump configured to pump the water from the water tank to the atomizer.

13. The apparatus of claim 1, wherein the compressed gas supply module comprises:
    a gas tank configured to store the compressed gas; and
    a pressure regulator configured to measure the pressure of the compressed gas supplied from the gas tank to the atomizer.

14. The apparatus of claim 1, wherein the collector is configured to be connected to a lower end of the cyclone and to be detached from the lower end of the cyclone.

15. The apparatus of claim 1, further comprising a trapping pipe connected a lower end of the cyclone and the collector and configured to allow a movement of the powder from the cyclone to the collector, wherein the collector is configured to be connected to a lower end of the trapping pipe and to be detached from the lower end of the trapping pipe.

16. The apparatus of claim 15, further comprising:
a gate valve installed at the trapping pipe;
a swing gate installed at the trapping pipe and between the lower end of the cyclone and the gate valve; and
a pressure gauge arranged between the lower end of the cyclone and the swing gate.

17. An apparatus for processing a substrate, the apparatus comprising:
a reaction chamber configured to process the substrate by using a reaction gas;
a vacuum pump configured to provide the reaction chamber with vacuum to discharge an exhaust material from the reaction chamber;
a cyclone connected to the reaction chamber and the vacuum pump and configured to provide the exhaust material with a swirling flow;
an atomization module providing the cyclone with a mist to convert the exhaust material into a powder through a wet oxidation reaction; and
a collector configured to collect the powder from the cyclone,
wherein the atomization module includes:
an atomizer configured to form the mist;
a water supply module configured to supply water to the atomizer and to measure a flux of the water supplied to the atomizer;
a compressed gas supply module configured to supply a compressed gas to the atomizer and to measure a pressure of the compressed gas supplied to the atomizer;
a density transmitter configured to measure a density of the mist provided from the atomizer to the cyclone; and
a density controller configured to control the density of the mist formed by the atomizer based on data of the flux of water that received from the water supply module, data of pressure of compressed gas that is received from the compressed gas supply module, and data of the density of the mist that is received from the density transmitter.

18. The apparatus of claim 17, wherein an operation of the atomization module and an operation of the collector are performed in real time during processing of the substrate in the reaction chamber.

* * * * *